US009603289B1

(12) United States Patent
Shearman et al.

(10) Patent No.: US 9,603,289 B1
(45) Date of Patent: Mar. 21, 2017

(54) CHASSIS ARRANGEMENT SYSTEMS AND METHODS FOR DUAL DEPTH CARDS AND DUAL DEPTH FARADAY CAGES

(71) Applicant: Ciena Corporation, Hanover, MD (US)

(72) Inventors: Simon John Edward Shearman, Almonte (CA); Anthony Mayenburg, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 14/995,310

(22) Filed: Jan. 14, 2016

(51) Int. Cl.
| | |
|---|---|
| *G06F 1/16* | (2006.01) |
| *H05K 9/00* | (2006.01) |
| *H05K 7/20* | (2006.01) |
| *H05K 7/14* | (2006.01) |
| *H05K 5/00* | (2006.01) |
| *H05K 7/00* | (2006.01) |

(52) U.S. Cl.
CPC ......... *H05K 9/0007* (2013.01); *H05K 7/1489* (2013.01); *H05K 7/20736* (2013.01)

(58) Field of Classification Search
CPC . G06F 1/1601–1/1611; G06F 1/1613–1/1698; G06F 1/18–1/189; H05K 5/00–5/069; H05K 7/00–7/186; H05K 9/0007; H05K 7/1489; H05K 7/20736
USPC ............ 361/679.01–679.45, 679.55–679.61, 361/724–727, 756, 741, 686, 687, 688, 361/696, 697, 787, 789, 794, 701–703, 361/709, 807–810; 348/787, 789, 794; 349/56–60; 312/223.1–223.3
See application file for complete search history.

(56) References Cited

U.S. PATENT DOCUMENTS

| | | | |
|---|---|---|---|
| 3,874,444 A | 4/1975 | Perce et al. | |
| 4,837,663 A * | 6/1989 | Zushi | H05K 7/20572 361/695 |
| 5,136,464 A * | 8/1992 | Ohmori | H05K 7/20572 361/694 |
| 5,995,368 A * | 11/1999 | Lee | H05K 7/20572 361/695 |
| 6,078,503 A * | 6/2000 | Gallagher | G06F 1/16 108/61 |
| 6,698,079 B1 | 3/2004 | Mimlitch, III et al. | |
| 7,126,820 B2 | 10/2006 | Wei | |
| 7,184,267 B2 | 2/2007 | Patel | |
| 7,259,961 B2 | 8/2007 | Lucero et al. | |
| 7,420,806 B1 * | 9/2008 | Lima | H05K 7/20736 165/104.33 |

(Continued)

FOREIGN PATENT DOCUMENTS

WO      2010022597 A1    3/2010

*Primary Examiner* — Anthony Haughton
*Assistant Examiner* — Razmeen Gafur
(74) *Attorney, Agent, or Firm* — Clements Bernard Walker PLLC; Christopher L. Bernard; Lawrence A. Baratta, Jr.

(57) ABSTRACT

A chassis arrangement includes different depth cards with associated Faraday cages. The chassis arrangement provides support for a first set of cards at a first depth and with a first set of fans, the chassis forming a Faraday cage with either set of cards. The second depth can be greater than the first depth, providing additional space for components to support additional functionality. Changing the first set of fans with the second set of fans and upgrading the first set of cards to the second set of cards is performed in-service, extending a life span of the chassis through in-service upgrades to multiple chassis configurations.

20 Claims, 15 Drawing Sheets

(56) References Cited

U.S. PATENT DOCUMENTS

| | | |
|---|---|---|
| 7,447,020 B2 | 11/2008 | Xia et al. |
| 7,633,754 B1 | 12/2009 | Mumper |
| 7,701,710 B2 | 4/2010 | Tanaka et al. |
| 7,864,519 B2 | 1/2011 | Lin et al. |
| 7,933,120 B2 | 4/2011 | Tanaka et al. |
| 7,957,133 B2 | 6/2011 | Zieman et al. |
| 8,154,867 B2 | 4/2012 | Shearman et al. |
| 2002/0001175 A1* | 1/2002 | Unrein ............... G06F 1/16 361/679.46 |
| 2002/0061102 A1* | 5/2002 | Miyazaki ............ H04Q 1/10 379/330 |
| 2003/0174474 A1* | 9/2003 | Mair ............... H05K 7/1425 361/752 |
| 2004/0032722 A1* | 2/2004 | Wrycraft ........... H05K 7/1488 361/725 |
| 2005/0078449 A1* | 4/2005 | Makooi ............ H04Q 1/035 361/695 |
| 2005/0099771 A1* | 5/2005 | Wei ................ H04Q 1/15 361/694 |
| 2005/0286222 A1* | 12/2005 | Lucero ........... H05K 7/20563 361/690 |
| 2006/0139895 A1* | 6/2006 | Justason ............ G06F 1/182 361/753 |
| 2006/0148398 A1* | 7/2006 | Ruch ............... H05K 5/0213 454/184 |
| 2007/0035926 A1* | 2/2007 | Xia ............... H01L 23/3672 361/695 |
| 2007/0258211 A1* | 11/2007 | Sonobe ........... H05K 7/20572 361/695 |
| 2008/0192454 A1* | 8/2008 | Knutsson ........... H05K 7/1425 361/796 |
| 2008/0225479 A1* | 9/2008 | Zieman ............ G06F 1/20 361/694 |
| 2009/0168329 A1* | 7/2009 | Ellis ............... G06F 1/16 361/679.46 |
| 2011/0304980 A1* | 12/2011 | Adkins ............ G06F 1/20 361/679.47 |
| 2013/0100610 A1* | 4/2013 | Schneider ....... H05K 7/20572 361/690 |
| 2013/0329379 A1* | 12/2013 | Hohmann ........... H02J 7/345 361/736 |
| 2015/0139223 A1* | 5/2015 | Mayenburg ........ H05K 5/0213 370/357 |
| 2015/0189787 A1* | 7/2015 | Bailey ............ H05K 7/1489 361/679.48 |
| 2015/0305193 A1* | 10/2015 | Reynov ........... H05K 7/20736 361/690 |

* cited by examiner

CHASSIS ARRANGEMENT SYSTEMS AND METHODS FOR DUAL DEPTH CARDS AND DUAL DEPTH FARADAY CAGES

FIELD OF THE DISCLOSURE

The present disclosure generally relates to networking hardware systems and methods. More particularly, the present disclosure relates to chassis arrangement systems and methods for dual depth cards and dual depth Faraday cages.

BACKGROUND OF THE DISCLOSURE

In telecommunications, networking, high-performance computing, etc., chassis (which can also be referred to as shelves, housings, etc.) are used to house modules, line cards, switch cards, blades, server cards, etc. (collectively referred to as "cards" herein). Cards include electrical circuitry, optical components, etc. enabling associated functionality, and the cards can plug into a backplane, midplane, etc. in the chassis. This hardware architecture is well-known in the art and advantageously enables plug and play functionality where a network element or node formed by the chassis can have expandable functionality based on card selection. A Faraday cage is an enclosure formed by a conductive material or a mesh of the conductive material, used to block electrical fields. Faraday cages are important and required for the chassis to reduce or prevent Electromagnetic Interference (EMI). Conventionally, Faraday cages are designed in the chassis to cover a set of cards, each of which is about the same physical size or depth. In an application where a chassis supports a current sized card, but may support a larger sized card in the future, e.g., with more power and components as needed, the chassis has to be able to support physically both types of cards, which is not possible with conventional Faraday cage designs. Conventionally, to change the size of the cards, an entirely new chassis is required to support the different sized cards. This is the current state-of-the-art in the industry where every couple of years, operators need to buy a new shelf to support different sized cards. As technology evolves, the costs of new chassis are becoming significant. There exists a need to support different depth Faraday cages in the same chassis to support different depth cards, extending obsolesce of the chassis.

BRIEF SUMMARY OF THE DISCLOSURE

In an exemplary embodiment, a method of upgrading a chassis with different depth cards with associated Faraday cages includes operating a chassis with a first set of cards at a first depth and with a first set of fans, the chassis forming a first Faraday cage with the first set of cards; changing the first set of fans for a second set of fans; upgrading the first set of cards to a second set of cards, at a second depth different from the first depth; and operating the chassis with second set of cards at the second depth and with the second set of fans, the chassis forming a second Faraday cage with the second set of cards. The second depth can be greater than the first depth, providing additional space for components to support additional functionality. The first Faraday cage can be smaller than the second Faraday cage. The first set of fans and the second set of fans can be hot-swappable in-service and the second set of fans can include more fans than the first set of fans. The first Faraday cage and the second Faraday cage can be formed by a chassis section, a backplane in the chassis, and gaskets coupled to faceplates of the first set of cards or the second set of cards. The chassis can be a switch chassis, and wherein the first set of cards and the second set of cards can be switch cards providing one or more of Time Division Multiplexing (TDM) switching and packet switching. The second set of cards can include optical modules for expansion of a switching fabric to multiple chassis. The changing and the upgrading can be performed responsive to adding one or more of additional functionality and capacity to the chassis with the different depth cards providing an increased life span of the chassis. The changing and the upgrading can be performed in-service.

In another exemplary embodiment, a chassis supporting different depth cards with associated Faraday cages includes a chassis section including a top side, a bottom side, a left side, and a right side, wherein the chassis section is configured to receive selectively a first set of cards and a second set of cards; a backplane at a rear of the chassis including connectors configured to connect to connectors on one or more of the first set of cards and the second set of cards; a first set of gaskets and a second set of gaskets inside the chassis section, wherein the first set of gaskets are at a first depth and configured to form a first front section with faceplates from the first set of cards and the second set of gaskets are at a second depth and configured to form a second front section with faceplates from the second set of cards; and one of a first set of fans and a second set of fans disposed to the chassis section, wherein the associated Faraday cages include a first Faraday cage when the first set of cards are slotted in the chassis and a second Faraday cage when the second set of cards are slotted in the chassis. The second depth can be greater than the first depth, providing additional space for components to support additional functionality. The first Faraday cage can be smaller than the second Faraday cage. The first set of fans and the second set of fans can be hot-swappable in-service and the second set of fans include more fans than the first set of fans. The chassis can be a switch chassis, and wherein the first set of cards and the second set of cards can be switch cards providing one or more of Time Division Multiplexing (TDM) switching and packet switching. The second set of cards can include optical modules for expansion of a switching fabric to multiple chassis. The first set of fans can be changed for the second set of fans and the first set of cards are replaced with the second set of cards responsive to adding one or more of additional functionality and capacity to the chassis with the different depth cards providing an increased life span of the chassis. The change of the first set of fans and the replacement of the first set of cards can be performed in-service.

In a further exemplary embodiment, a network element supporting different depth cards with associated Faraday cages includes one or more chassis each including a backplane for one or more of data and power connectivity, wherein the one or more chassis include a switch chassis supporting the different depth cards including a first set of switch cards with a first depth and a second set of switch cards with a second depth; and one of a first set of fans and a second set of fans disposed to the switch chassis, wherein the first set of switch cards and the second set of switch cards are switch cards providing one or more of Time Division Multiplexing (TDM) switching and packet switching, and wherein the first set of switch cards form a first Faraday cage when slotted in the switch chassis and the second set of switch cards form a second Faraday cage when slotted in the switch chassis. The second depth can be greater than the first depth, providing additional space for components to support additional functionality. The second set of switch cards can include optical modules for expansion of a switching fabric to multiple chassis.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
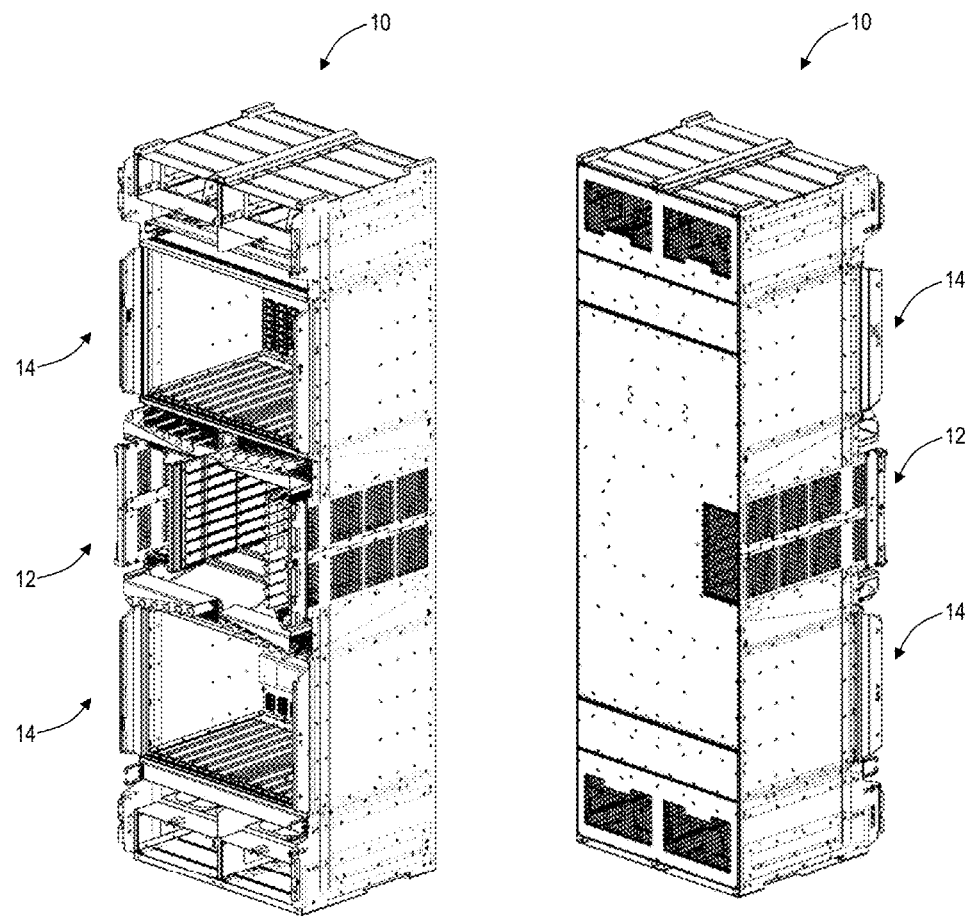
FIG. 1 is a perspective diagram of a front perspective view and a rear perspective view of a network element supporting different depth cards in a switch chassis.

Again, in various exemplary embodiments, the present disclosure relates to chassis arrangement systems and methods for dual depth cards and dual depth Faraday cages. The systems and methods can include a card Faraday cage for a chassis that can accept two different depth of cards. Each depth of card requires a unique cooling path and unique cooling unit, as well as an independent Faraday cage to prevent radiated and conducted EMI emissions. The systems and methods allow the release of a chassis that can accept different size circuit cards at a later date without having to update the chassis. Larger cards, with more power and greater cooling requirements, can be released at a later date in conjunction with a deeper cooling unit containing more fans. Again, the systems and methods can extend the operating lifetime of a chassis, offering expansion as capacity dictates. Thus, an operator can buy a chassis that is compatible with all cards planned at a future date. The addition of the deeper cards can allow a chassis to be turned into a multi-shelf switching product instead of a single shelf switching product.

In an exemplary embodiment, the card Faraday cage can include metal support sections between each set of fan modules. At each of these intersections, a set of EMI gaskets is placed to seal the front of the card faceplates to this support section. A honeycomb vent panel is used to attenuate signals in and out of the chassis while allowing low resistance to air flow through the card Faraday cage. Vent panels are expensive, so it is highly desirable to use one piece of honeycomb on either side of the card Faraday cage. Each honeycomb must be surrounded with EMI gasket that creates a conductive path to the boundaries of the card Faraday cage it is part of the EMI gaskets between the honeycomb, and the support sections break the card Faraday cage into sections.

A card Faraday cage is essentially a six-sided box to prevent electrical noise waves (EMI) from entering and exiting. Air must pass through two of the parallel walls to cool the cards in the chassis. Two perpendicular but parallel walls create two other sides of the box. The front of the chassis is always the faceplates, and the rear of the chassis is always the backplane. Moving the faceplates forward, by the depth of a fan unit in the cooling module increases the depth of the card Faraday cage. Gaskets from between the support walls and honeycomb on one side along with gaskets on the support wall to the card faceplates on the other side complete the card Faraday cage at different depths. A deeper fan module (e.g., three fans deep instead of two fans deep) can be used when deeper cards are used in the same chassis at a later date.

With the systems and methods, an existing card can be released with its existing cooling unit. When more switching capacity or functionality is required in the chassis, a new set of cards and cooling units can be deployed to allow more space and cooling capacity. For example, this extra capacity will be essential in the future to transform a standalone switching chassis into a multi-shelf switching configuration. Again, the systems and methods allow the release of a chassis that can accommodate future cards that are not yet designed, but are predicted to require 50% or more space and power. Without the systems and methods, it would not be possible to provide multi-chassis ready switching platforms for availability with a platform first release. Without the systems and methods, the customer or operator would have to rip out the first release chassis and replace them with a new version/release of chassis to be able to house and cool larger and hotter versions of next generation cards which require more space and cooling than is already released on working cards. The card Faraday cage provides the ability to deploy existing shallow cooling units, and a future deeper cooling unit containing 50% more fans for better cooling. This card Faraday cage provides the ability to contain EMI noise at two different depths, allowing the ability to deploy existing shallow cards, and a future deeper cards with 50% more space for components, cooling and additional functionality.

Referring to FIG. 1, in an exemplary embodiment, a perspective diagram illustrates a front perspective view and a rear perspective view of a network element 10 supporting different depth cards in a switch chassis 12. In an exemplary embodiment, the network element 10 is a switching platform and can include the switch chassis 12 supporting selectively insertable switch cards 16 (not shown in FIG. 1) and one or more line chassis 14 supporting selectively insertable line cards (not shown in FIG. 1). The switch chassis 12 includes a card Faraday cage 18 (see, e.g., FIG. 9) arrangement for either depth of the switch cards. That is, the switch chassis 12 includes the card Faraday cage 18 arrangement for either depth of the switch cards 16.

The foregoing descriptions of the chassis 12, the card Faraday cage 18, and the cards 16 is illustrated with reference to the switch cards 16 and the switch chassis 12 in a single and a multi-shelf chassis configuration. For example, the switch cards 16 can be used in a Terabit switching system, switching Time Division Multiplexing (TDM) and/or packet traffic. Those of ordinary skill in the art will recognize the chassis 12, the card Faraday cage 18, and the cards 16 can be implemented with any type of network element, node, etc. in various applications such as telecommunications, networking, high-performance computing, storage, and the like, and reference to the switch chassis 12 is merely for illustration of an exemplary embodiment. Additionally, the systems and methods could equally apply to the line chassis 14 or any other chassis.

Figure 2:
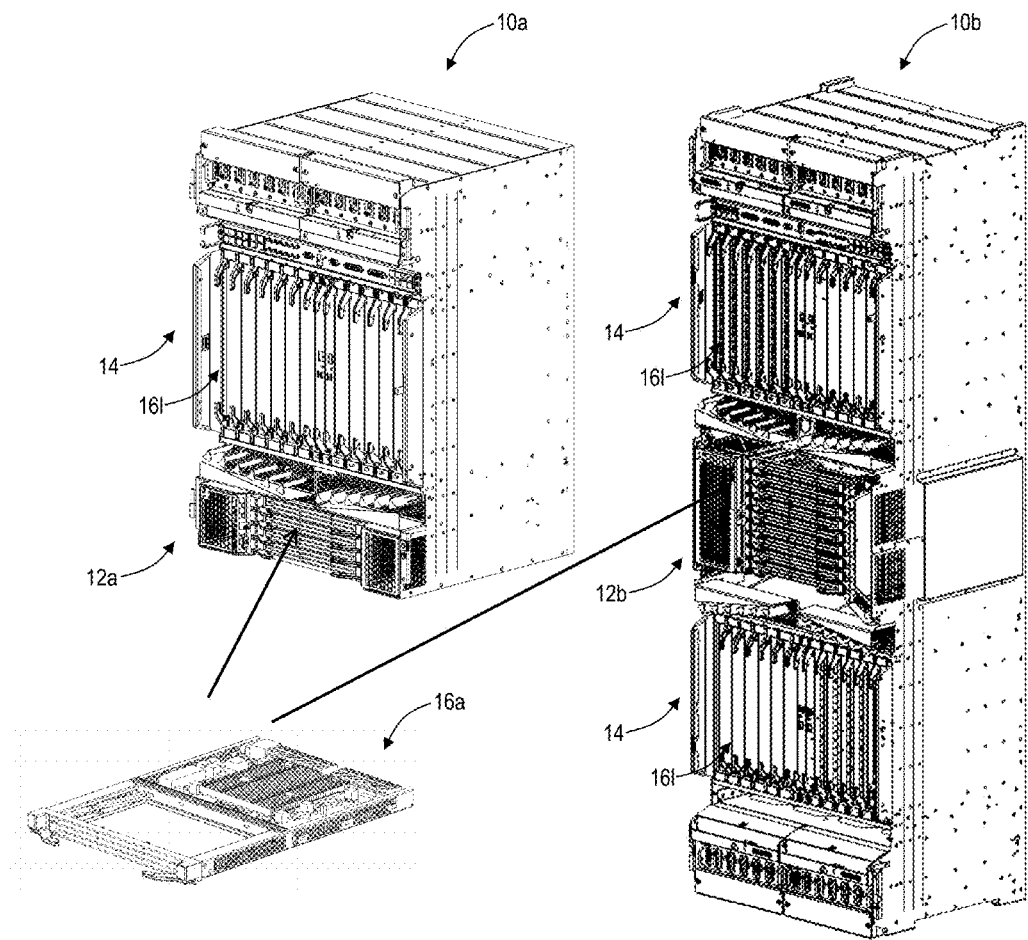
FIGS. 2 and 3 are perspective diagrams of a front perspective view of network elements and two different depth switch cards, with the switch card in FIG. 3 being larger than the switch card in FIG. 3.
Figure 3:
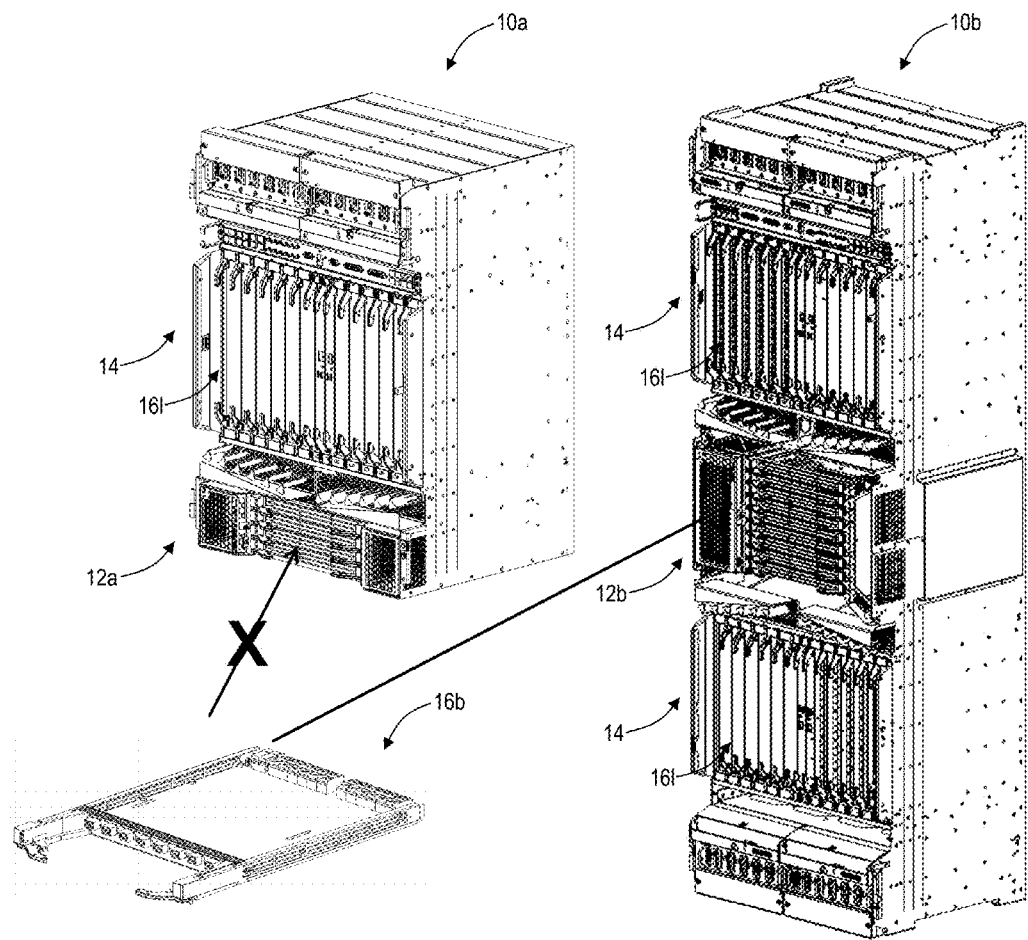

Referring to FIGS. 2 and 3, in an exemplary embodiment, perspective diagrams illustrate a front perspective view of network elements 10a, 10b and two different depth switch cards 16a, 16b. In this exemplary embodiment, the network element 10a is about a half rack height chassis with one line chassis 14 and one switch chassis 12a. The network element 10b is a full rack height chassis with two line chassis 14 and one switch chassis 12b. Of course, other embodiments are contemplated. The switch card 16a has a smaller depth in the switch chassis 12a than the switch card 16b. The switch card 16b includes an additional surface area such as on a Printed Circuit Board (PCB) for additional components and functionality.

Also, FIGS. 2 and 3 illustrate the cards 16 included in the chassis 12, 14. Specifically, the line chassis 14 includes line card 16l and the switch chassis 12 includes the switch cards 16a, 16b. In an exemplary embodiment, the network element 10a, with the switch chassis 12a, can only support the switch card 16a, and not the switch card 16b. The network element 10b, with the switch chassis 12b, includes the card Faraday cage 18 which supports either of the switch cards 16a, 16b. In operation, the network element 10b can be deployed in lieu of the network element 10a, but use the switch card 12a and only populate one of the line chassis 14 as needed. However, future support is preserved in the switch chassis 12b for the larger switch card 16b and the additional line chassis 14.

Figure 4:
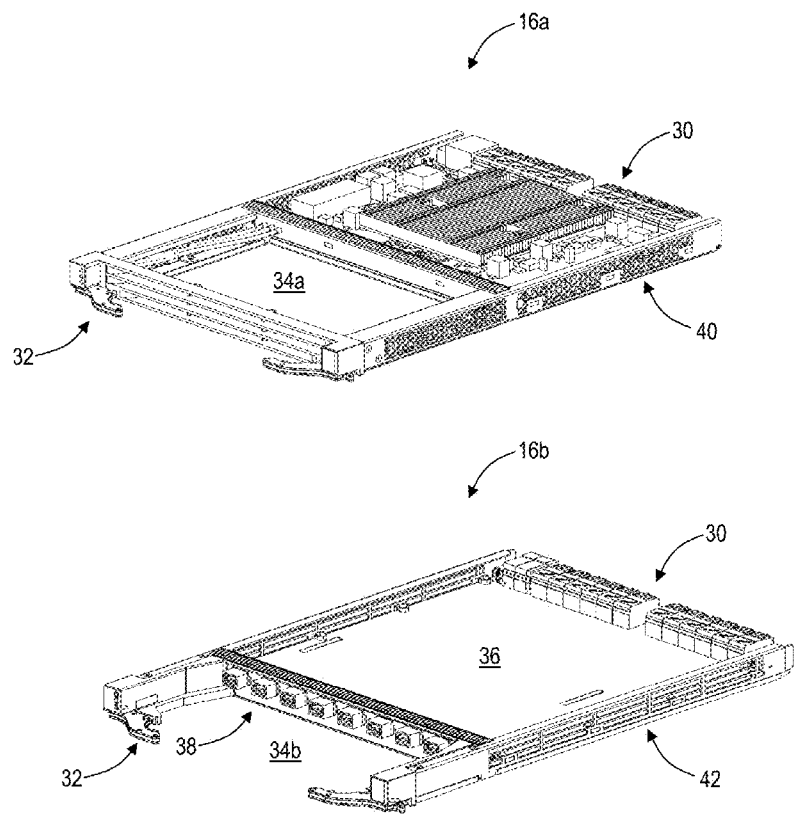
FIGS. 4 and 5 are diagrams of perspective views (FIG. 4) and top views (FIG. 5) of the different depth switch cards.
Figure 5:
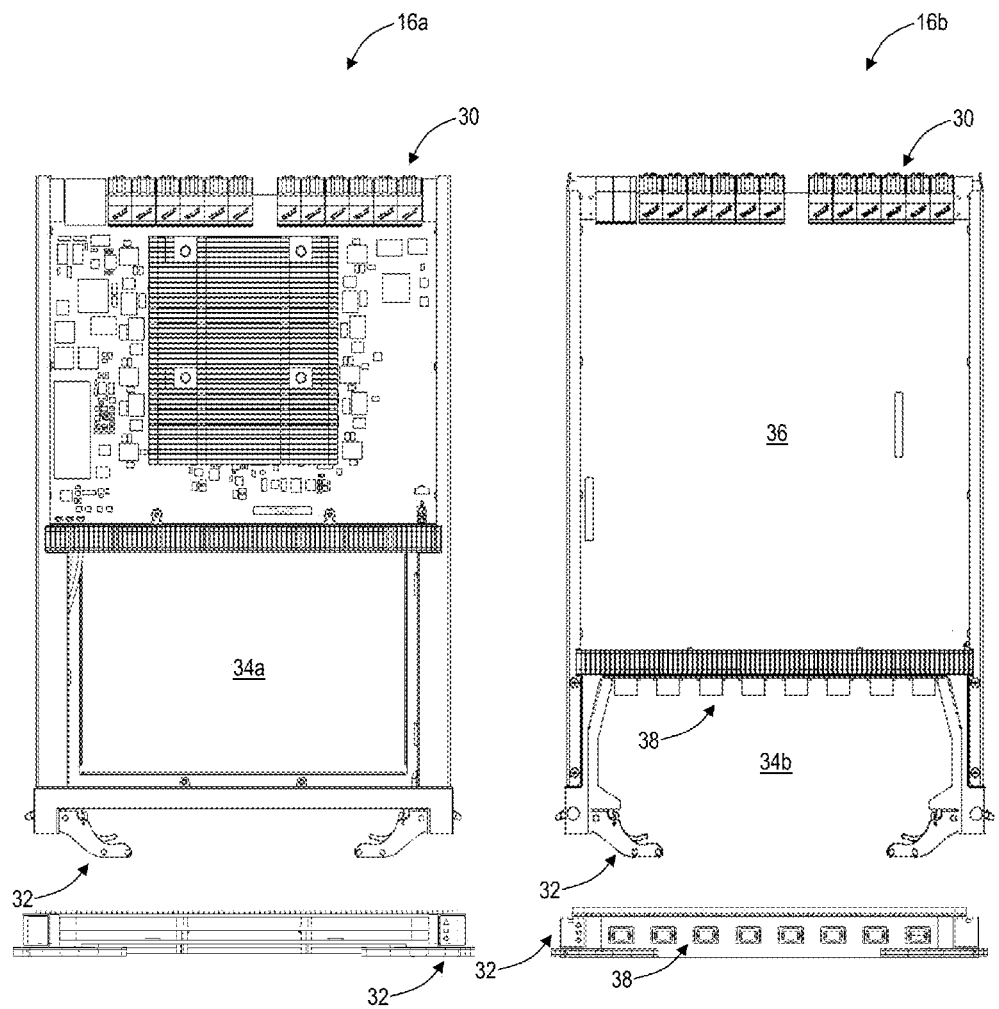

Referring to FIGS. 4 and 5, in exemplary embodiments, diagrams illustrate perspective views (FIG. 4) and top views (FIG. 5) of the different depth switch cards 16a, 16b. The switch card 16a can be referred to as a single, existing switch module and the switch card 16b can be referred to as a multi-shelf switch module. Again, the switch cards 16a, 16b can perform similar functions with the switch card 16b providing additional space to support more functionality. Both of the switch cards 16a, 16b have the same overall depth, connectors 30 to a backplane in the chassis 12, and latches 32 to engage selectively/disengage the chassis 12. The switch card 16a has a recessed portion 34a, which is described in detail in commonly-assigned U.S. Pat. No. 9,203,782 B2 (Dec. 1, 2015) entitled "HIGH DENSITY NETWORKING SHELF AND SYSTEM," the contents of which are incorporated by reference herein. The recessed portion 34a is formed due to the switch cards 16a being shorter in depth than the line cards 12l and positioned orthogonally therefrom.

The switch card 16b extends partially into the recessed portion providing a larger PCB 36 to accommodate additional functionality, such as, for example, on-board optics on the switch card 16b. In an exemplary embodiment, the switch cards 16b include optical connections 38 on a faceplate to support switch capacity expansion in a multi-shelf configuration. Specifically, the optical connections 38 allow the switch chassis 12b to form a larger, overall switching fabric with one or more additional switch chassis 12b. The switch card 16b also has a recessed portion 34b, albeit smaller than the recessed portion 34a due to the larger sized PCB 36. The switch card 16a includes openings 40 (an inlet) for air intake and exhaust on either side wall of the switch card 16a whereas the switch card 16b includes larger openings, both in size and surface area.

Figure 6:
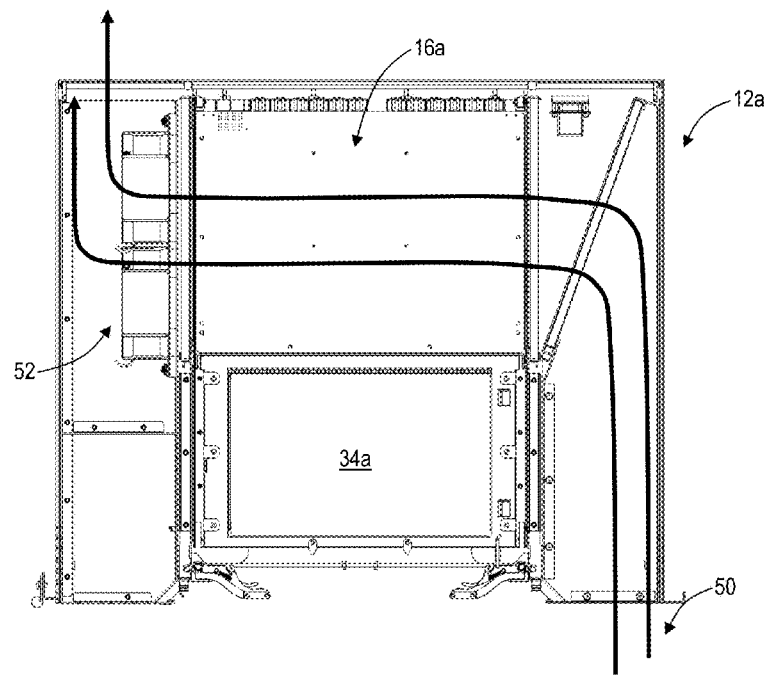
FIGS. 6-8 are horizontal cross sections illustrate airflow in the switch chassis (FIG. 6) and the switch chassis (FIGS. 7 and 8), illustrating the switch chassis in FIGS. 7 and 8 operating with either depth switch card.
Figure 7:
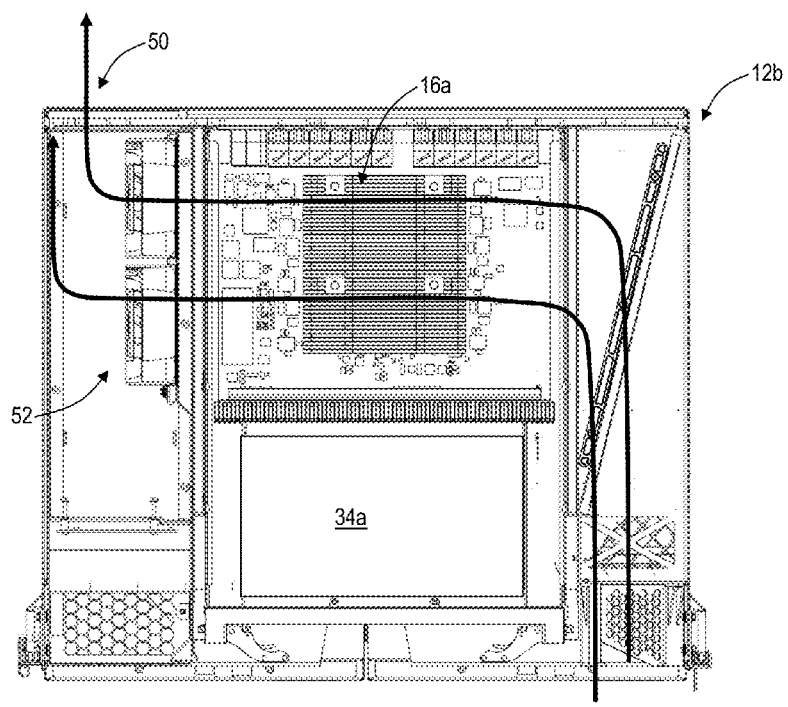
Figure 8:
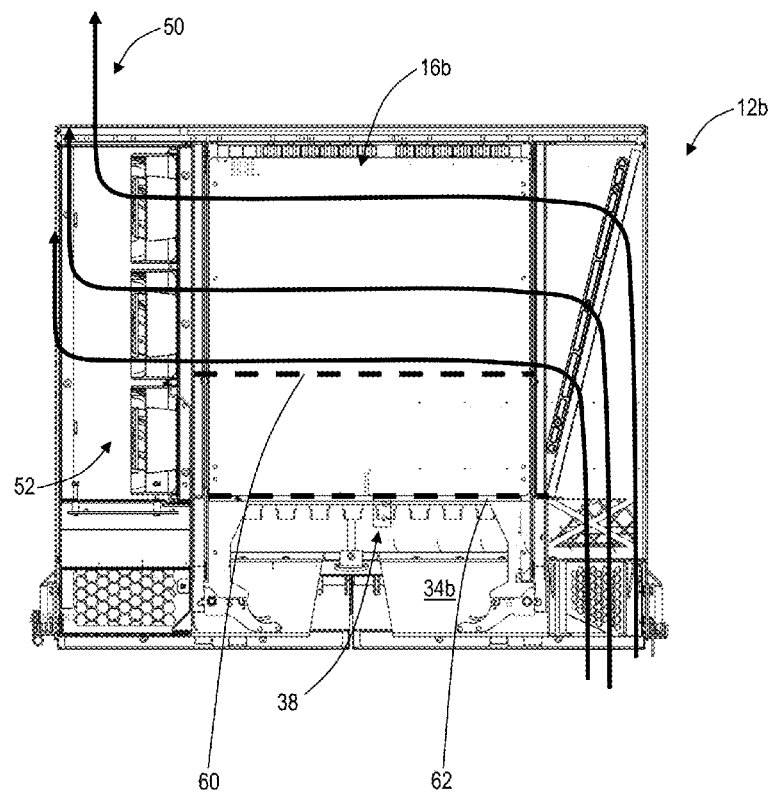

Referring to FIGS. 6-8, in an exemplary embodiment, horizontal cross sections illustrate airflow 50 in the switch chassis 12a (FIG. 6) and the switch chassis 12b (FIGS. 7 and 8), illustrating the switch chassis 12b operating with either depth switch card 16a, 16b. FIG. 6 illustrates the switch chassis 12a operating with two fans 52. In an exemplary embodiment, the airflow 50 has an intake on a front portion of the switch chassis 12a and is directed right to left over the switch cards 16a by the two fans 52 for exhaust on a rear portion of the switch chassis 12a. The switch chassis 12a is not designed to support the switch cards 16b, only the switch cards 16a. Of note, the airflow 50 is also described in detail in commonly-assigned U.S. Pat. No. 9,203,782 referenced above.

In various exemplary embodiments, the switch chassis 12b illustrates a chassis arrangement for dual depth cards and dual depth card Faraday cages. Specifically, the switch chassis 12b is designed to support operation with either of the switch cards 16a, 16b and forming a corresponding card Faraday cage 18 with each, despite different depths. FIG. 7 illustrates the switch chassis 12b with two fans 52, with the switch cards 16a, and the recessed portion 34a. FIG. 8 illustrates the switch chassis 12b with three fans 52, with the switch cards 16b, the recessed portion 34b, and the optical connections 38.

In an exemplary embodiment, the airflow 50 has an intake on a front portion of the switch chassis 12b and is directed right to left over the switch cards 16a (FIG. 7) by the two fans 52 and over the switch cards 16b (FIG. 8) by the three fans 52 for exhaust on a rear portion of the switch chassis 12b. The switch chassis 12b is designed to support operation with either of the switch cards 16a, 16b. However, for purposes of the card Faraday cage 18, the switch chassis 12b should operate with only one type of the switch cards 16a, 16b at a time. Of course, during an upgrade procedure, described herein, the switch cards 16a, 16b can operate concurrently for a portion of time during the procedure.

Specifically, in FIG. 7, in a first configuration, the switch chassis 12b is configured to operate the first depth switch cards 16a with a fan configuration including two fans 52. In FIG. 8, in a second configuration, the switch chassis 12b is configured to operate the second depth switch cards 16b with a fan configuration including three fans 52. As part of the two configurations, the switch chassis 12b is configured to support two different card Faraday cage 18 arrangements with different front locations 60, 62 for the card Faraday cage 18. Specifically, in FIG. 8, the different front locations 60, 62 are illustrated for the card Faraday cage 18. With the switch cards 16a in the switch chassis 12b, the card Faraday cage 18 has the front location 60, and with the switch cards 16b in the switch chassis 12b, the card Faraday cage 18 has the front location 62. Also, the fans 52 can be modular and pluggable in the network element 10, with a first set providing the two fans 52 for the switch cards 16a and a second set providing the three fans 52 for the switch cards 16b.

Figure 9:
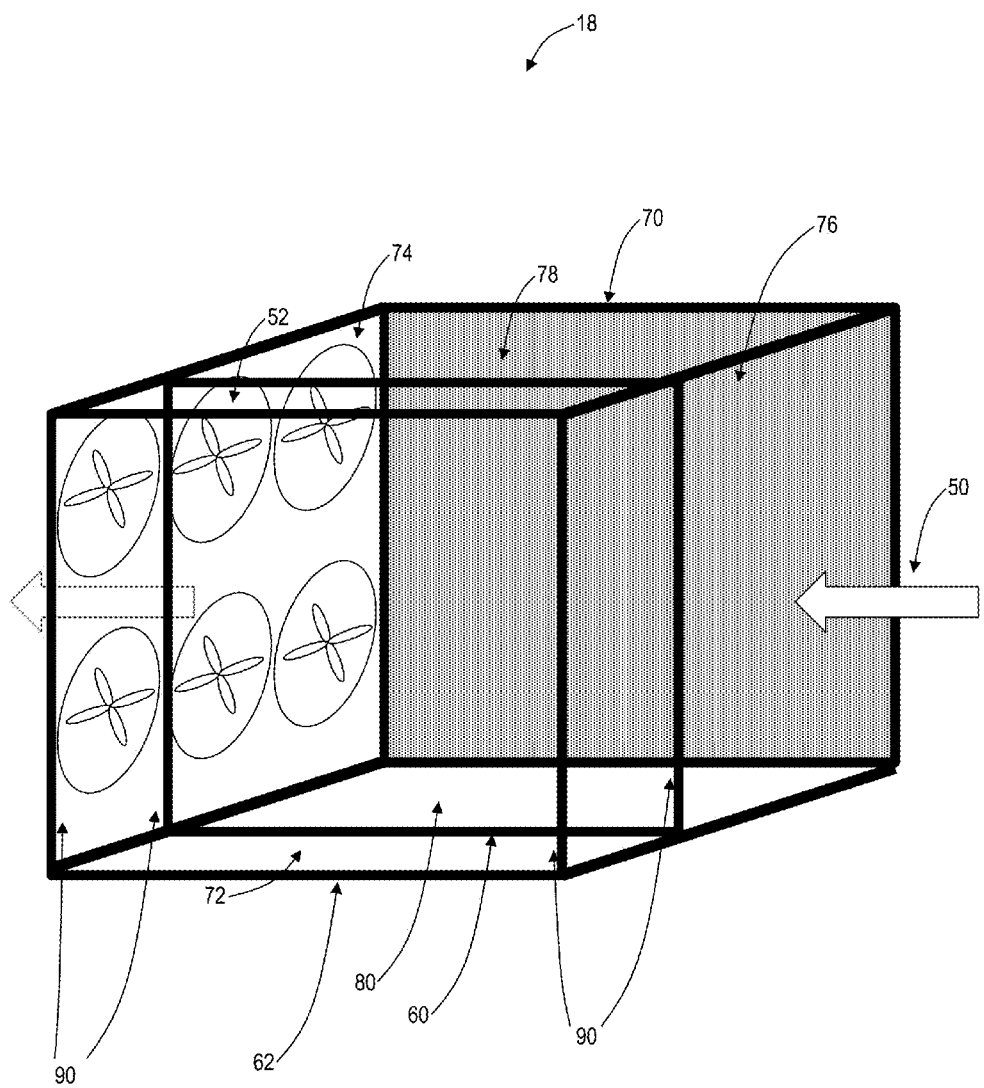
FIG. 9 is a simplified diagram of the card Faraday cage arrangement in the switch chassis, with the different front locations based on the different depth switch cards.

Referring to FIG. 9, in an exemplary embodiment, a simplified diagram illustrates the card Faraday cage 18 arrangement in the switch chassis 12b, with the different front locations 60, 62 based on the switch cards 16a, 16b. Again, the card Faraday cage 18 is a six sided box providing EMI protection for the associated cards 16 contained therein. In the systems and methods, the switch chassis 12b supports, at least, two different sized six sided boxes based on the different depths of the switch cards 16a, 16b. The six sided box for the card Faraday cage 18 includes a rear side 70, a front side 72, a left side 74, a right side 76, a top side 78, and a bottom side 80.

The switch chassis 12b includes a backplane 82 at the rear side 70 of the card Faraday cage 18 which is common to both arrangements. The backplane 82 is configured to connect, power and/or data, with the connectors 30, which are common to both of the switch cards 16a, 16b. The front side 72 is the same effective area for either of the switch cards 16a, 16b, but its location is determined by the front locations 60, 62. Specifically, the front location 60 is closer to the backplane 82 with the switch cards 16a and the front location 62 is further from the backplane 82 with the switch cards 16b. Thus, the surface area of the sides 74, 76, 78, 80 is different based on the front locations 60, 62. The front locations 60, 62 each have gaskets 90 to a honeycomb structure 100 on the sides 74, 76. For illustration purposes, the airflow 50 can be from right to left, but other embodiments are contemplated. Again, there are two sets of fans 52, lengthwise across the left side 74 for the switch cards 16a, and three sets of fans 52, lengthwise across the left side 74 for the switch cards 16b. Of course, based on a height of the switch chassis 16b, there can be stacked fans 52 (FIG. 9 illustrates two stacked sets of fans 52).

Thus, when the switch cards 16a are inserted into the switch chassis 12b, there is the card Faraday cage 18 with the front location 60, and when the switch cards 16b are inserted into the switch chassis 12b, there is the card Faraday cage 18 with the front location 62. Thus, the switch chassis 12b supports dual depth Faraday cages based on card depth.

Figure 10:
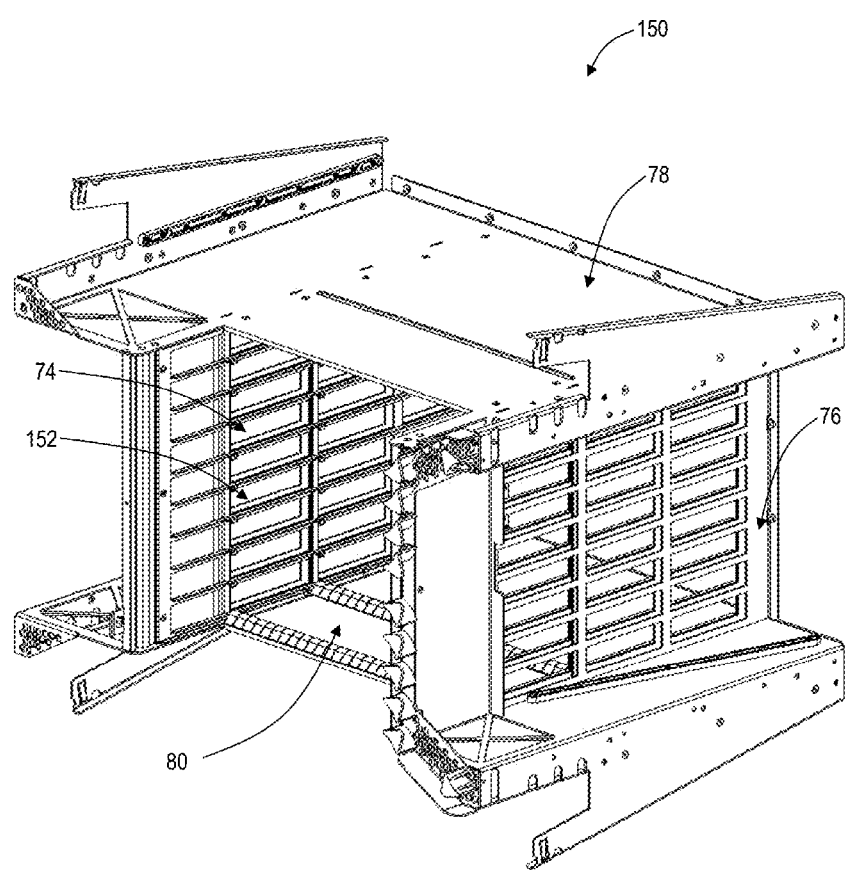
FIGS. 10-14 are perspective diagrams illustrates a switch chassis section and associated close up views, located internal to the switch chassis, configured to receive selectively the different depth switch cards and to form the left side, the right side, the top side, and the bottom side of the card Faraday cage.
Figure 11:
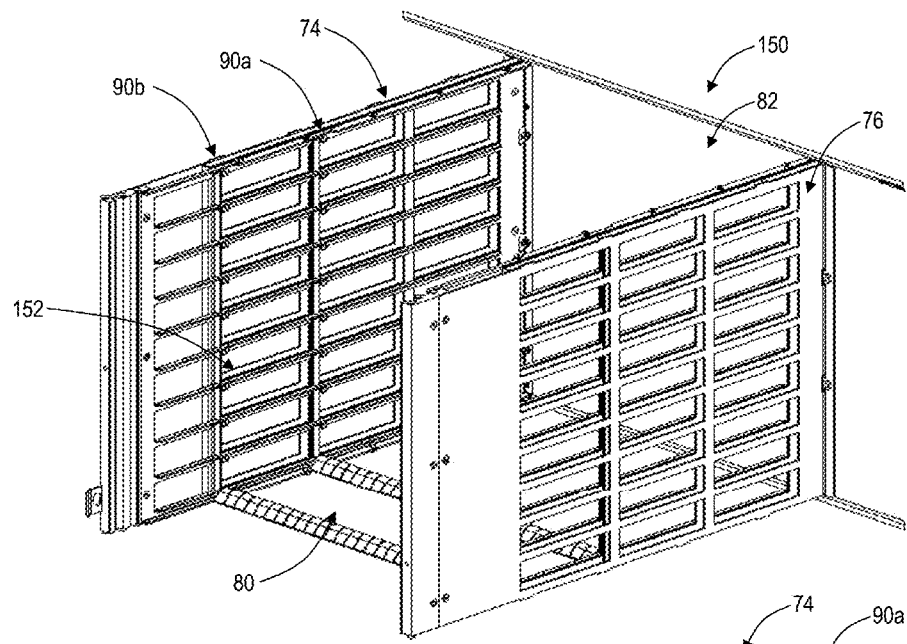
Figure 12:
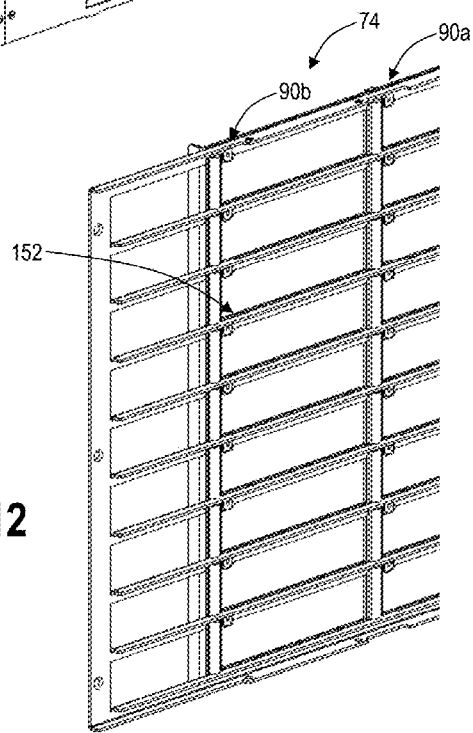
Figure 13:
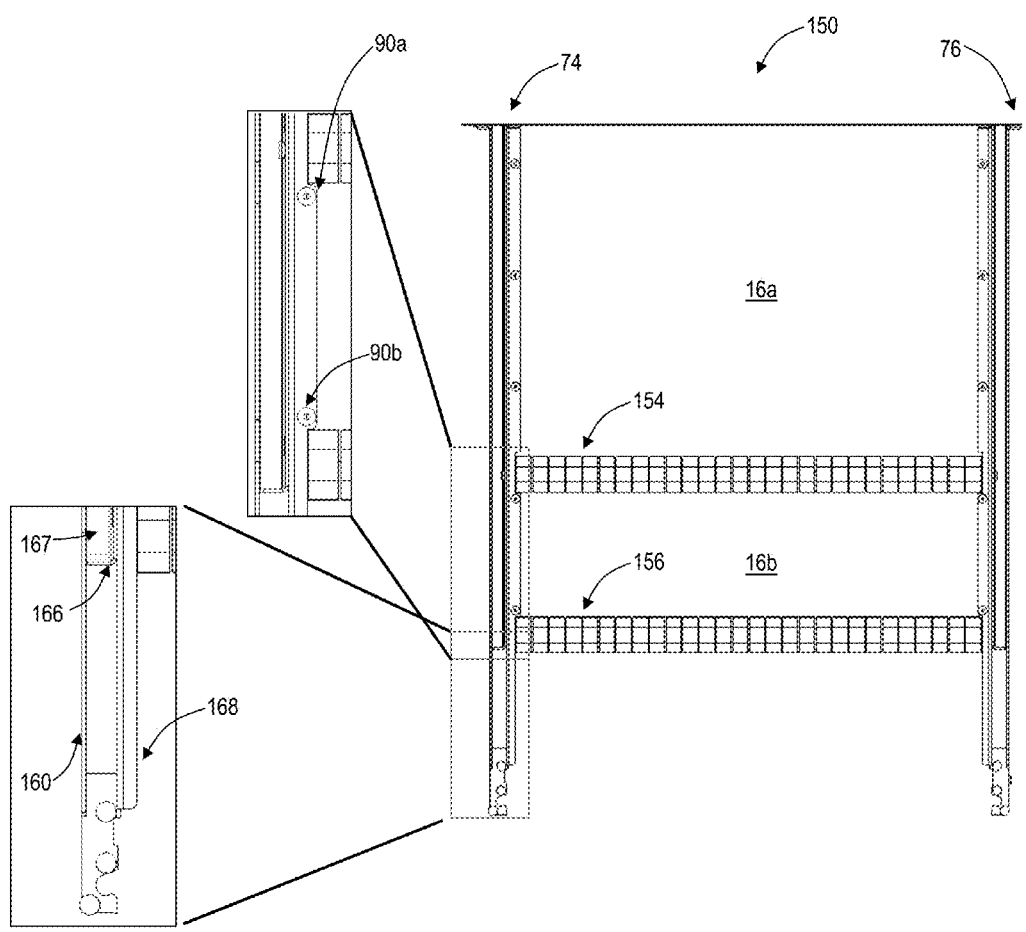
Figure 14:
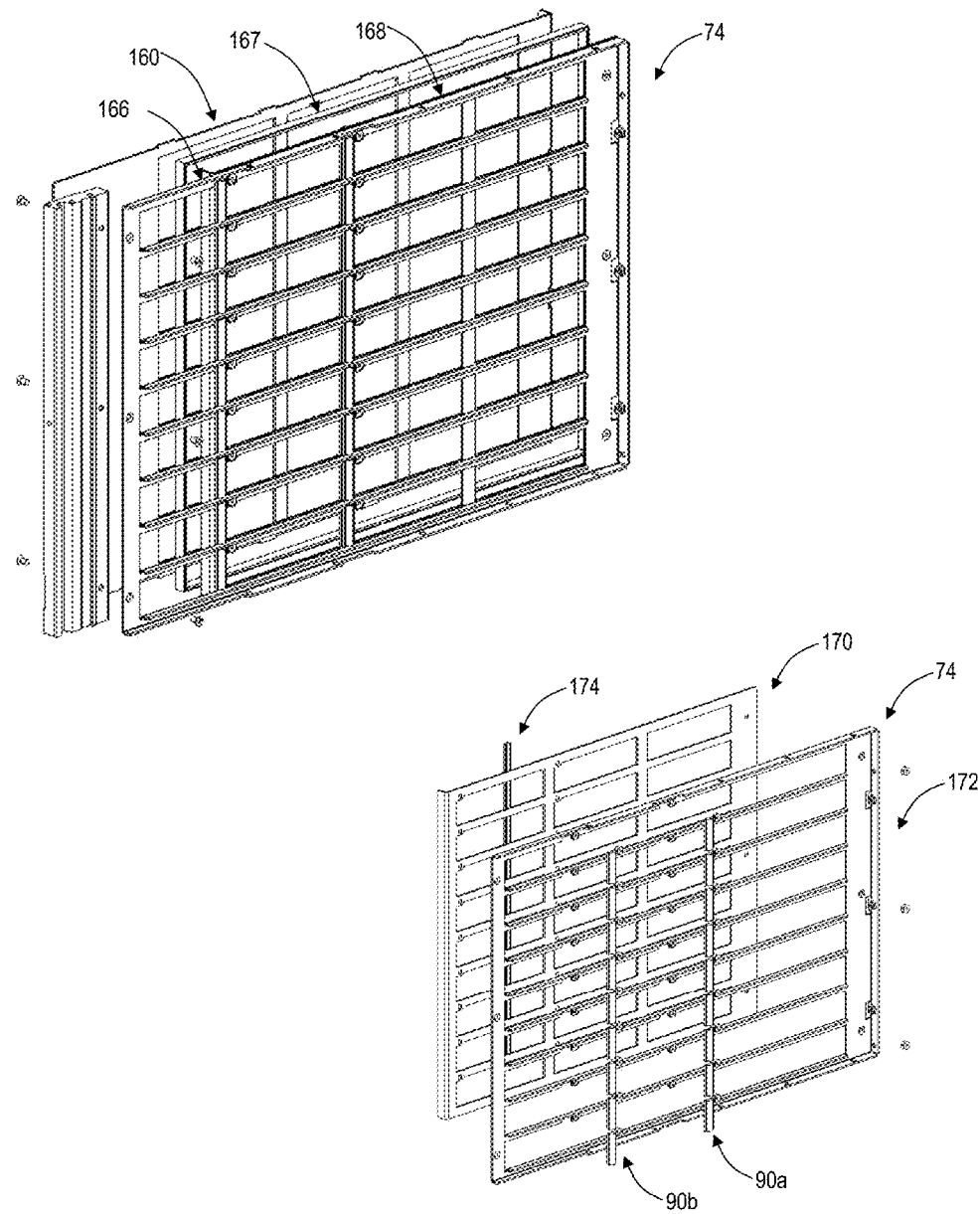

Referring to FIGS. 10-14, in exemplary embodiments, perspective diagrams illustrates a switch chassis section 150 and associated close up views, located internal to the switch chassis 12b, configured to selectively receive the switch cards 16a, 16b, and to form the left side 74, the right side 76, the top side 78, and the bottom side 80 of the card Faraday cage 18. FIG. 10 is a perspective view of the switch chassis section 150 for the switch chassis 12b. FIG. 11 is a perspective view of the left side 74 and the right side 76 of the switch chassis section 150 illustrating current gaskets 90a, and future gaskets 90b on continuous rails 152 on the sides 74, 76, supporting the switch cards 16a, 16b. FIG. 12 is a perspective view of the left side 74 illustrating a close-up view of the gaskets 90a, 90b. FIG. 13 is a top view of the sides 74, 76 with both the switch cards 16a, 16b included. FIG. 14 is a close-up view of the left side 74 illustrating a wall assembly.

In an exemplary embodiment, the switch cards 16a, 16b are oriented horizontally when slotted in the switch chassis section 150, supported by continuous rails 152 on the sides 74, 76. Of course, other embodiments are also contemplated such as vertically slotted cards 16. The card Faraday cage 18 is formed by a combination of the cards 16a, 16b themselves, namely their faceplates, the gaskets 90a, 90b, the switch chassis section 150, and the backplane 82. The gaskets 90a, 90b are EMI seals which fill the space between card faceplates 154, 156 and the sides 74, 76, generally to prevent leakage from or into the joined objects while under compression. To support dual card Faraday cages 18, the switch chassis section 150 includes the two sets of gaskets 90a, 90b at the appropriate front locations 60, 62.

FIG. 13 illustrates a close-up view of where the gaskets 90a, 90b meet the faceplates 154, 156, i.e., the gasket 90a meets the faceplate 154 on the switch card 16a, and the gasket 90b meets the faceplate 156 on the switch card 16b. FIG. 13 also illustrates a close-up of the left side 74 which includes a guide wall 160 for cooling units 162, 164, a honeycomb retainer 166, and a guide 168 for the switch cards 16a, 16b. Note, while the illustrations in FIG. 13 are directed to the left side 74, the right side 76 can include a similar structure. Note, also, where the cards 16 slot horizontally rather than vertically, the same structures could be on the top side 78 and the bottom side 80.

FIG. 14 illustrates various components of the left side 74, namely the guide wall 160, the honeycomb retainer 166, a honeycomb vent panel 167, and the guide 168. Additionally, FIG. 14 illustrates components of the guide 168 which includes a riveted guide rail assembly 170, guide rails 172, an EMI gasket 174 between the guide 168 and the honeycomb retainer 166, and the gaskets 90a, 90b. The honeycomb retainer 166/honeycomb vent panel 167 can be a metal mesh, allowing for air ventilation while preventing EMI interference. Any suitable materials are contemplated for the various components of the switch chassis section 150.

Figure 15:
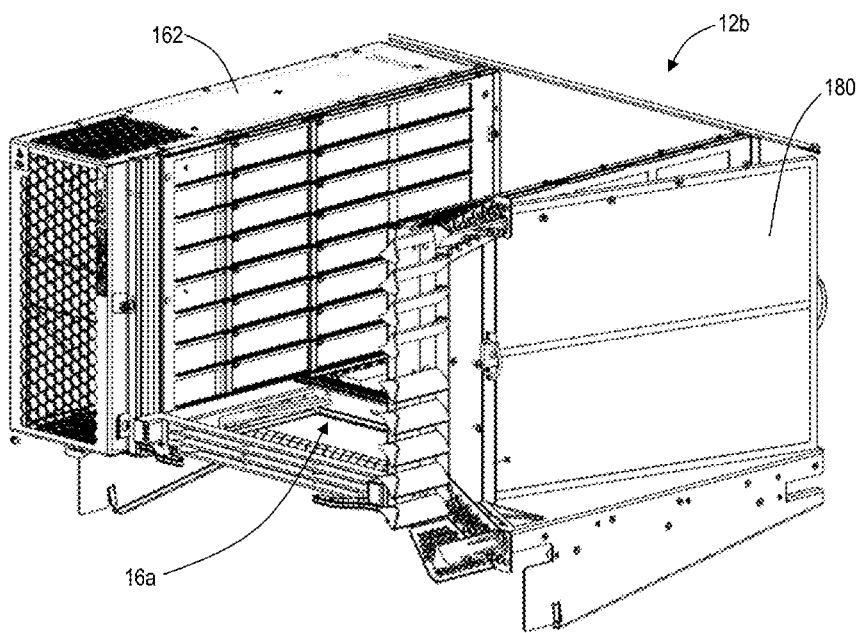
FIGS. 15 and 16 are perspective diagrams of internal views of the chassis with the switch cards (FIG. 15) and the switch cards (FIG. 16)
Figure 16:
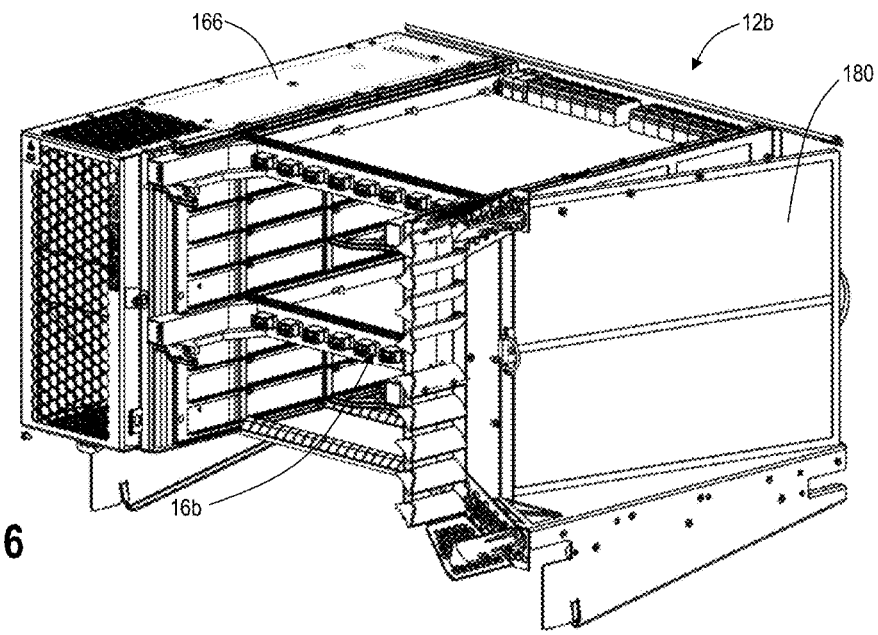

Referring to FIGS. 15 and 16, in an exemplary embodiment, perspective diagrams illustrate internal views of the chassis 12b with the switch cards 16a (FIG. 15) and the switch cards 16b (FIG. 16). The chassis 12b includes an air filter 180 in an air intake on one side. FIGS. 15 and 16 illustrate the switch cards 16a, 16b slotted in the switch chassis section 150. FIG. 15 includes the cooling unit 162 which includes two fans 52 along the left side 74. FIG. 16 includes the cooling unit 164 which includes three fans 52 along the left side 74. Note, in these examples, the switch chassis section 150 supports additional height so the cooling units 162, 164 can have stacked two and three fan configurations.

Figures 17, 18:
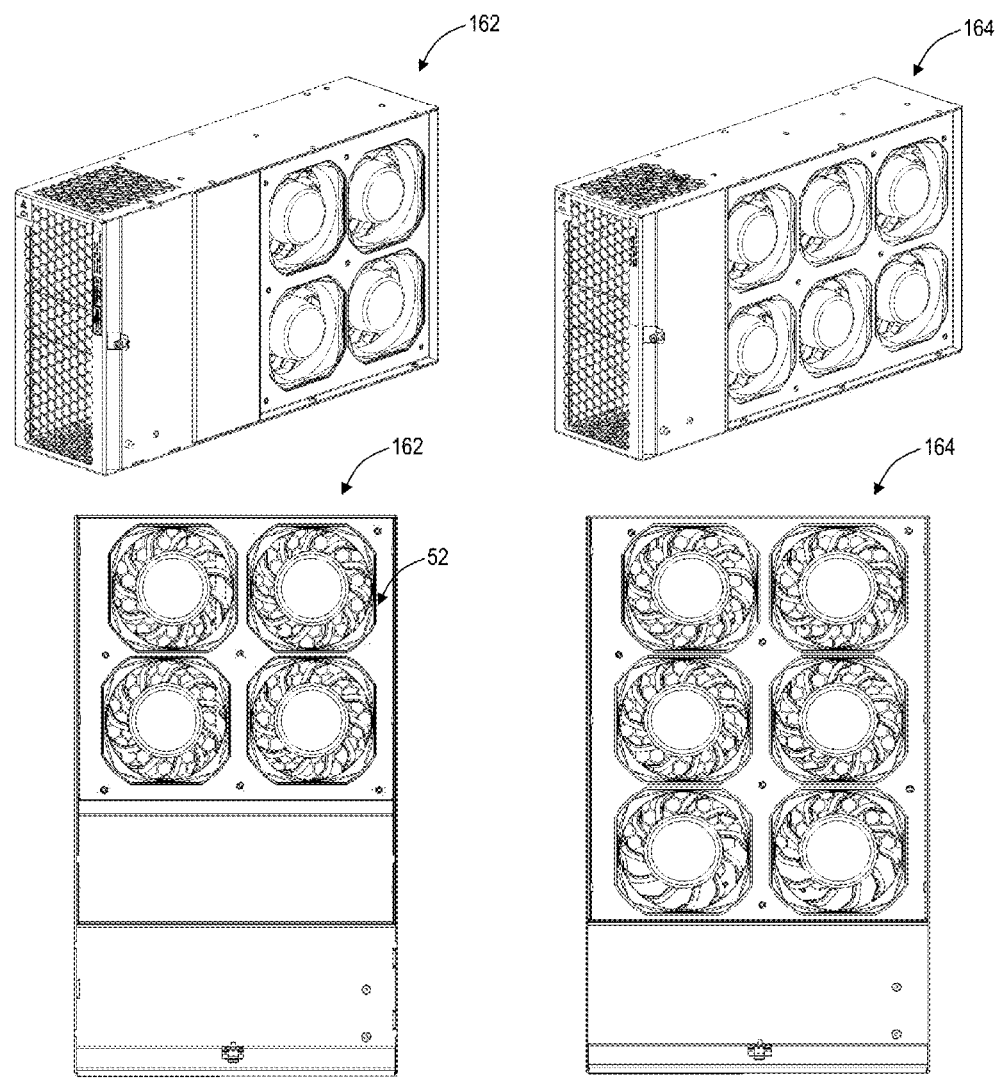
FIGS. 17 and 18 are perspective diagrams of the cooling units for two fan or three fan configurations.

Referring to FIGS. 17 and 18, in an exemplary embodiment, perspective diagrams illustrate the cooling units 162, 164 for two fan or three fan configurations. The cooling units 162, 164 are each designed to support the air cooling requirements of the switch chassis 16b with either the switch cards 16a, 16b. Again, the cooling unit 162 with two fans 52 along the depth of the switch chassis 12b is used for the switch cards 16a, and the cooling unit 164 with three fans 52 along the depth of the switch chassis 12b is used for the switch cards 16b. For ease of upgrades, the cooling units 162, 164 are hot swappable, in-service in the network element 10.

Figure 19:
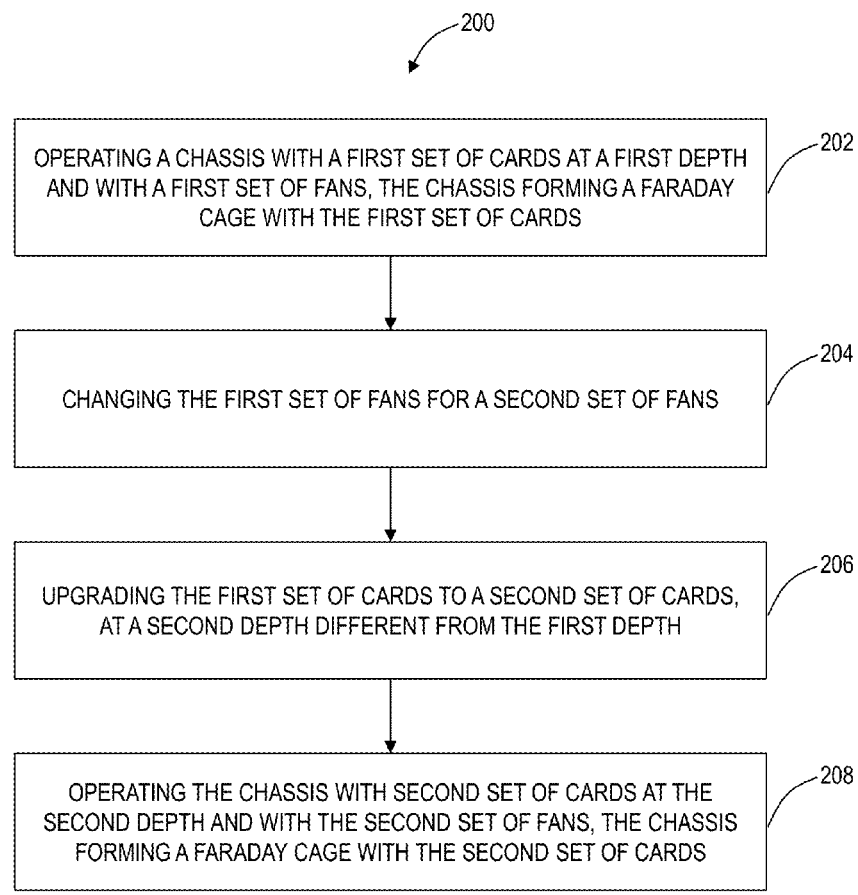
FIG. 19 is a flowchart of a process upgrading a chassis in service with different depth cards with associated Faraday cages.

Referring to FIG. 19, in an exemplary embodiment, a flowchart of a process 200 upgrading a chassis in service with different depth cards with associated Faraday cages. The process 200 contemplates operation with the various components described herein to support a chassis 12 that can be upgraded to different depth cards, in-service, to provide additional functionality. The process 200 includes operating a chassis with a first set of cards at a first depth and with a first set of fans, the chassis forming a Faraday cage with the first set of cards (step 202); changing the first set of fans for a second set of fans (step 204); upgrading the first set of cards to a second set of cards, at a second depth different from the first depth (step 206); and operating the chassis with second set of cards at the second depth and with the second set of fans, the chassis forming a Faraday cage with the second set of cards (step 208).

The second set of cards can have the second depth greater than the first depth, providing additional space for components to support additional functionality. The Faraday cage with the first set of cards can be smaller than the Faraday cage with the second set of cards. The first set of fans and the second set of fans can be hot swappable in-service and the second set of fans can include more fans than the first set of fans. The Faraday cage with the first set of cards and the Faraday cage with the second set of cards are formed by a chassis section, a backplane in the chassis, and gaskets coupled to faceplates of the first set of cards or the second set of cards. The chassis can be a switch chassis, and wherein the first set of cards and the second set of cards can be switch cards providing one or more of Time Division Multiplexing (TDM) switching and packet switching. The second set of cards can include optical modules for expansion of a switching fabric to multiple chassis. The changing and the upgrading can be performed responsive to adding additional functionality and/or capacity to the chassis with the different depth cards providing an increased life span of the chassis.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method of upgrading a chassis with different depth cards with associated Faraday cages, the method comprising:
    operating a chassis with a first set of cards at a first depth and with a first set of fans, the chassis forming a first Faraday cage with the first set of cards;
    changing the first set of fans for a second set of fans;
    upgrading the first set of cards to a second set of cards, at a second depth different from the first depth; and
    operating the chassis with second set of cards at the second depth and with the second set of fans, the chassis forming a second Faraday cage with the second set of cards.

2. The method of claim 1, wherein the second depth is greater than the first depth, providing additional space for components to support additional functionality.

3. The method of claim 1, wherein the first Faraday cage is smaller than the second Faraday cage.

4. The method of claim 1, wherein the first set of fans and the second set of fans are hot-swappable in-service and the second set of fans comprise more fans than the first set of fans.

5. The method of claim 1, wherein the first Faraday cage and the second Faraday cage are formed by a chassis section, a backplane in the chassis, and gaskets coupled to faceplates of the first set of cards or the second set of cards.

6. The method of claim 1, wherein the chassis is a switch chassis, and wherein the first set of cards and the second set of cards are switch cards providing one or more of Time Division Multiplexing (TDM) switching and packet switching.

7. The method of claim 6, wherein the second set of cards comprise optical modules for expansion of a switching fabric to multiple chassis.

8. The method of claim 1, wherein the changing and the upgrading is performed responsive to adding one or more of additional functionality and capacity to the chassis with the different depth cards providing an increased life span of the chassis.

9. The method of claim 1, wherein the changing and the upgrading is performed in-service.

10. A chassis supporting different depth cards with associated Faraday cages, the chassis comprising:
    a chassis section comprising a top side, a bottom side, a left side, and a right side, wherein the chassis section is configured to receive selectively a first set of cards and a second set of cards;
    a backplane at a rear of the chassis comprising connectors configured to connect to connectors on one or more of the first set of cards and the second set of cards;
    a first set of gaskets and a second set of gaskets inside the chassis section, wherein the first set of gaskets are at a first depth and configured to form a first front section with faceplates from the first set of cards and the second set of gaskets are at a second depth and configured to form a second front section with faceplates from the second set of cards; and
    one of a first set of fans and a second set of fans disposed to the chassis section,
    wherein the associated Faraday cages comprise a first Faraday cage when the first set of cards are slotted in the chassis and a second Faraday cage when the second set of cards are slotted in the chassis.

11. The chassis of claim 10, wherein the second depth is greater than the first depth, providing additional space for components to support additional functionality.

12. The chassis of claim 10, wherein the first Faraday cage is smaller than the second Faraday cage.

13. The chassis of claim 10, wherein the first set of fans and the second set of fans are hot-swappable in-service and the second set of fans comprise more fans than the first set of fans.

14. The chassis of claim 10, wherein the chassis is a switch chassis, and wherein the first set of cards and the second set of cards are switch cards providing one or more of Time Division Multiplexing (TDM) switching and packet switching.

15. The chassis of claim 14, wherein the second set of cards comprise optical modules for expansion of a switching fabric to multiple chassis.

16. The chassis of claim 10, wherein the first set of fans are changed for the second set of fans and the first set of cards are replaced with the second set of cards responsive to adding one or more of additional functionality and capacity to the chassis with the different depth cards providing an increased life span of the chassis.

17. The chassis of claim 16, wherein the change of the first set of fans and the replacement of the first set of cards is performed in-service.

18. A network element supporting different depth cards with associated Faraday cages, the network element comprising:
    one or more chassis each comprising a backplane for one or more of data and power connectivity, wherein the one or more chassis comprise a switch chassis supporting the different depth cards comprising a first set of switch cards with a first depth and a second set of switch cards with a second depth; and
    one of a first set of fans and a second set of fans disposed to the switch chassis,
    wherein the first set of switch cards and the second set of switch cards are switch cards providing one or more of Time Division Multiplexing (TDM) switching and packet switching, and
    wherein the first set of switch cards form a first Faraday cage when slotted in the switch chassis and the second set of switch cards form a second Faraday cage when slotted in the switch chassis.

19. The network element of claim 18, wherein the second depth is greater than the first depth, providing additional space for components to support additional functionality.

20. The network element of claim 18, wherein the second set of switch cards comprise optical modules for expansion of a switching fabric to multiple chassis.

\* \* \* \* \*